(12) United States Patent
Tseng

(10) Patent No.: US 6,417,033 B1
(45) Date of Patent: Jul. 9, 2002

(54) METHOD OF FABRICATING A SILICON ISLAND

(75) Inventor: Horng-Huei Tseng, Hsinchu (TW)

(73) Assignee: Vanguard International Semiconductor Corp., Hsinchu (TW)

( * ) Notice: Subject to any disclaimer, the term of this patent is extended or adjusted under 35 U.S.C. 154(b) by 15 days.

(21) Appl. No.: 09/741,611

(22) Filed: Dec. 19, 2000

(51) Int. Cl.[7] ............................ H01L 21/00; H01L 21/84
(52) U.S. Cl. ........................................ 438/156; 438/149
(58) Field of Search ............................. 438/156, 142, 438/149, 151, 412, 967

(56) References Cited

U.S. PATENT DOCUMENTS

| | | | | |
|---|---|---|---|---|
| 5,039,621 A | * | 8/1991 | Pollack | 437/21 |
| 5,691,230 A | * | 11/1997 | Forbes | 437/62 |
| 5,963,789 A | * | 10/1999 | Tsuchiaki | 438/62 |
| 6,015,725 A | * | 1/2000 | Hirayama | 438/156 |
| 6,174,784 B1 | * | 1/2001 | Forbes | 438/405 |
| 6,211,039 B1 | * | 4/2001 | Noble | 438/412 |
| 6,319,333 B1 | * | 11/2001 | Noble | 148/33.2 |

* cited by examiner

*Primary Examiner*—Alexander G. Ghyka
(74) *Attorney, Agent, or Firm*—J.C. Patents

(57) ABSTRACT

The invention provides a method of manufacturing a semiconductor device comprising the following steps. A silicon substrate is provided. A first oxidation-resistant layer is formed on the silicon substrate. The first oxidation-resistant layer and the silicon substrate are formed to form a trench. A second oxidation-resistant layer if formed on the first oxidation-resistant layer and inside the trench. A portion of the second oxidation-resistant layer is removed to form a spacer on sidewalls of the trench. A portion of the exposed silicon substrate on bottom of the trench is performed by directional etching to expose a portion of the sidewalls of the trench. A thermal oxidation step is performed on the exposed portion of the sidewall of the trench. The second spacer is removed and a dielectric layer is formed over the substrate to fill in the trench.

8 Claims, 3 Drawing Sheets

METHOD OF FABRICATING A SILICON ISLAND

BACKGROUND OF THE INVENTION

1. Field of the Invention

The present invention relates to a method of fabricating a silicon island in semiconductor substrate. More particularly, the invention provides a method of fabricating a silicon island of mono-crystalline silicon for making electronic devices.

2. Description of the Related Art

Since Silicon-On-Insulator (SOI) devices are fabricated on a thin silicon film on a insulator, the parasitic capacitance of the source/drain of MOSFET to the substrate below is greatly reduced and the operation speed is substantially improved compared to conventional microelectronic circuit fabrication on bulk silicon substrate (Bulk Devices). Thus SOI have tremendous advantage for very large scale integration (VLSI) of electronic devices over conventional Bulk Devices. In SOI fabrication, the channel length of the source/drain is reduced thereby decreasing the area and effectively increasing the integration of a semiconductor device. Additionally, device isolation of the SOI devices can be easily achieved with shallow trench isolation (STI) techniques by simply etching off unnecessary parts of silicon film surrounding areas to be used for SOI devices.

However, SOI devices are difficult to fabricate and expensive. Additionally, SOI devices have inherent drawbacks due to build-up of hot carrier generated during the operation. During SOI operation, from time to time, a high electric field concentrates around the drain region. Electric charges flowing in the channel are accelerated by the strong electric field around the drain and generates the opposite electric carriers by impact ionization which then flows back to the body of the device. Since SOI is completely isolated electrically from the substrate below, the created carriers cannot be drained into the substrate and thus builds up in the body of the SOI, this causes floating body effect, i.e. a shift of electrical potential in the body of SOI device with carrier build up. This floating body effects then induces undesirable transition in device performance such as change of threshold voltage with time.

Therefore, holes are confined inside the SOI device body. When a forward voltage is applied between the source and the body, holes in the body start to flow out of the source forming parasitic bipolar action path. With this new electron path formed away from gate electrode besides proper channel current path at the interface between silicon and gate oxide, the SOI device shows unexpected irregular operation so called kink effect.

Further, formation of electrical pathways through the insulating material requires process steps to open a small hole through the insulating region whose dimensions become less than 0.25 mm in the deep sub-micron device era (if the hole is larger compared with the insulating region, the device loses advantages of SOI device). Formation of such small holes precisely aligned within the insulating region whose dimensions are less than 0.25 mm is extremely difficult and almost impractical as a ULSI manufacturing method. Furthermore, the method requires a crystallization step even for constructing a single level planar circuit, which is inefficient, when a single crystal level is already available on the original substrate surface.

Therefore, improved devices structure and a simple fabrication which realize high speed operation as with conventional SOI devices but without any adverse effects related to the charge build-up is highly desired. In order to overcome the above defects a thin-foot charge drain beneath the conventional SOI structure to sweep out undesirable charge build-up generated by hot carrier effects during device operation desirable.

Referring to FIG. 1A, is a schematic diagram illustrating a conventional SOI, a silicon nitride film 102 about 2000 A thick is formed on a silicon substrate 100 using a CVD technique, a photoresist mask 104 is formed.

Next, referring to FIG. 1B, a reactive ion etching (RIE) is performed to penetrate etching through silicon nitride layer 102 and the underlying silicon substrate 100, forming a trench 105 forming a silicon island structure 112. During the etching process, a thin passivation layers 106 are formed on the sidewall of the trench 105.

Next, referring to FIG. 1C, an anisotropic (chemical) dry etching using CF4/02 plasma is performed. The passivation layers 106 forms a protective layer on the sidewalls and is unaffected by etching. While the horizontal bottom surface has no passivation layers are etched eroding the bottom surface and forming a foot of a silicon island 110 as shown.

However, there is a problem in fabricating a silicon island with a thin foot region under the island using the method as described above. It is very difficult to control the etching process for obtaining a desired foot thickness in a deep submicron device, often over-etching and breaking off of the structure 112 occurs.

SUMMARY OF THE INVENTION

The present invention provides an improved method of fabricating a thin-foot region underneath the SOI structure. In the method it is very easy to control the oxidation process for obtaining a desired foot thickness in a deep submicron device. The drawbacks of the conventional etching step, such as over-etching and breaking off of the island structure will not occur in the invention. The thin foot region is easily formed by controlling conditions of oxidation, such as time or temperature of oxidation.

The invention provides a method of manufacturing a semiconductor device comprising the following steps. A silicon substrate is provided. A first oxidation-resistant layer is formed on the silicon substrate. The first oxidation-resistant layer and the silicon substrate are formed to form a trench. A second oxidation-resistant layer if formed on the first oxidation-resistant layer and inside the trench. A portion of the second oxidation-resistant layer is removed to form a spacer on sidewalls of the trench. A portion of the exposed silicon substrate on bottom of the trench is performed by directional etching to expose a portion of the sidewalls of the trench. A thermal oxidation step is performed on the exposed portion of the sidewall of the trench. The second spacer is removed and a dielectric layer is formed over the substrate to fill in the trench.

It is to be understood that both the foregoing general description and the following detailed description are exemplary and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and together with the description serve to explain the principles of the invention. In the drawings.

DESCRIPTION OF THE PREFERRED EMBODIMENTS

Figure 1A:
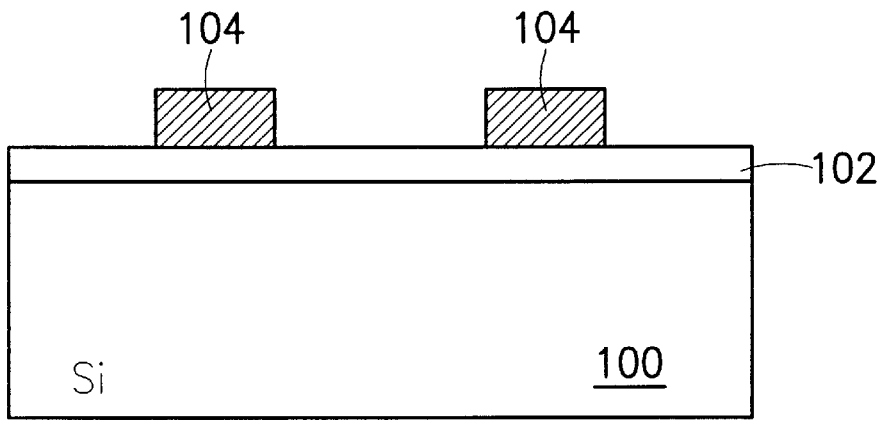
FIGS. 1A through 1C are schematic cross-sectional views showing the conventional silicon island structure.
Figure 1B:
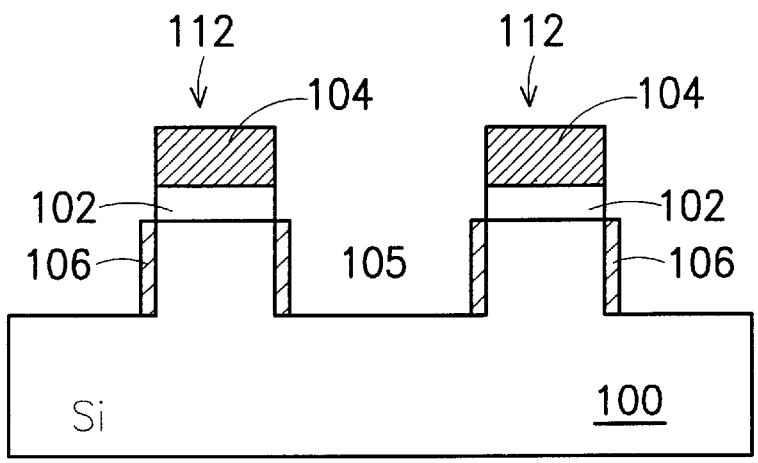
Figure 1C:
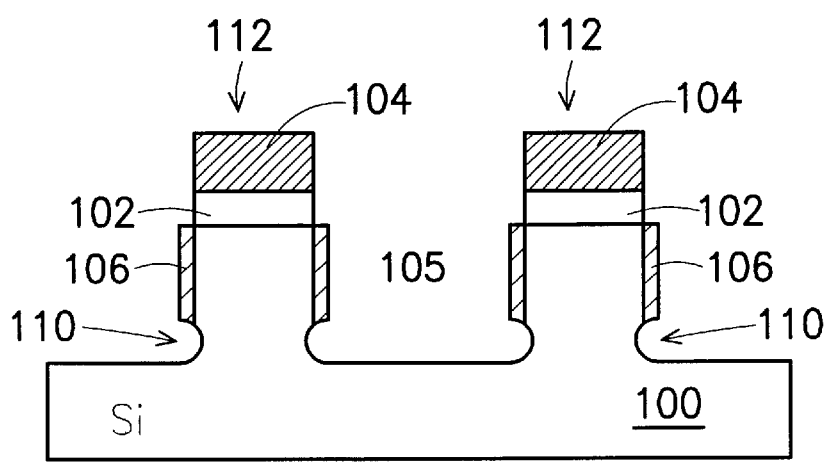

Reference will be made in detail to the present preferred embodiments of the invention, examples of which are illustrated in the accompanying drawings. Wherever possible, the same reference numbers are used in the drawings and the description to refer to the same or like parts.

FIGS. 2A through 2E are schematic, cross-sectional views showing the progression of fabrication steps forming a silicon island according to a first preferred embodiment of this invention.

Figure 2A:
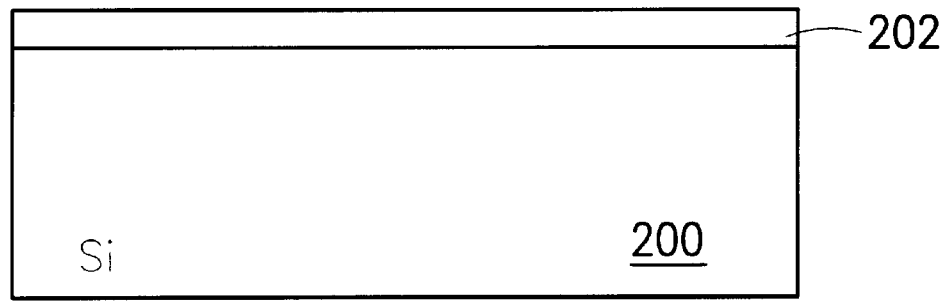
FIGS. 2A through 2E are schematic, cross sectional views showing the silicon island structure according to a preferred embodiment of the invention.

Referring to FIG. 2A, a silicon substrate 200 is provided. A first oxidation-resistant layer 202 made of a material from oxidation is formed on the silicon substrate 200. The oxidation-resistant layer 202 is made of, for example, silicon oxide with a thickness of about 500 to 2000 Å. The first oxidation-resistant layer 202 can be formed by chemical vapor deposition (CVD).

Figure 2B:
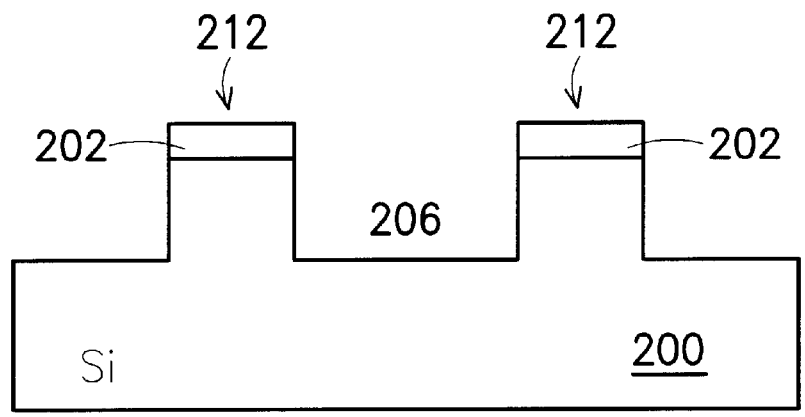

Referring to FIG. 2B, the first oxidation-resistant layer 202 and the silicon substrate 200 are patterned by, for example, anisotropic etching to form a trench 206. A silicon island structure 212 is then formed on the silicon substrate 200.

Figure 2C:
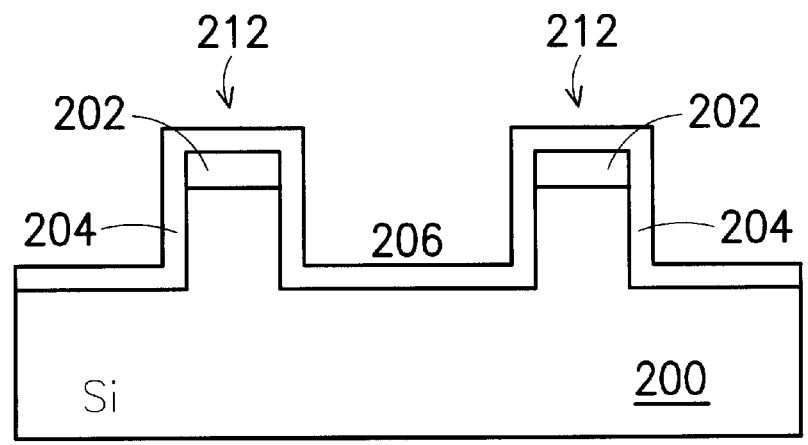
Figure 2D:
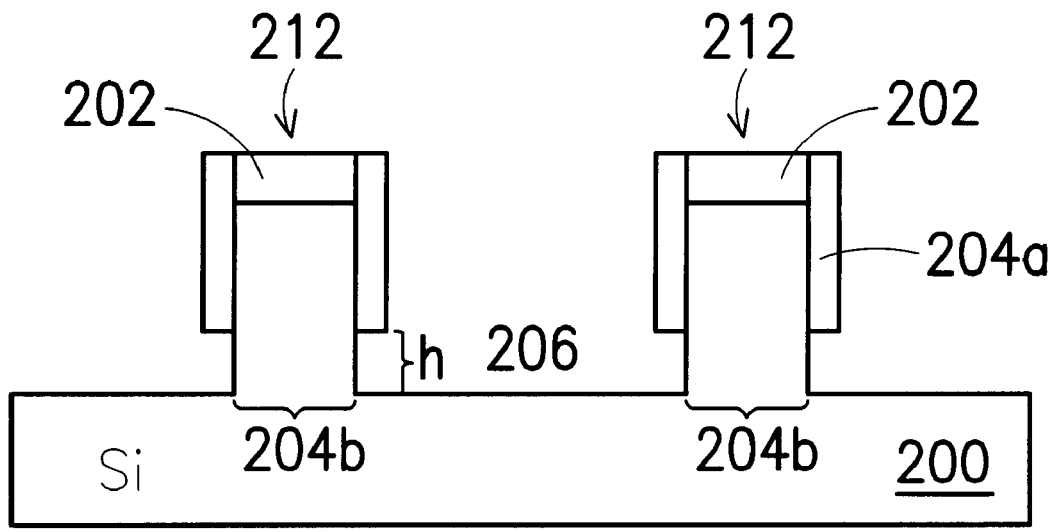

Referring to FIG. 2C, a second oxidation-resistant layer 204 is formed over the silicon substrate 200 and the first oxidation-resistant layer 202. The second oxidation-resistant layer 204 can be a silicon oxide layer with a thickness of about 200 to 1000 Å and can be formed by CVD. The second oxidation-resistant layer 204 is then performed by a etching back process for example plasma etching back to form oxidation-resistant spacers 204a on the sidewall of the trench 206, as shown in FIG. 2D. Then a directional etching process is performed on the silicon substrate 200. An exposed portion of the silicon substrate 200, which is not covered by the first oxidation-resistant layer 202 and the oxidation-resistant spacers 204a, is etched to a depth h from a bottom level of the spacers 204a. Silicon island structures 204b are then formed thereafter, as shown in FIG. 2D.

Figure 2E:
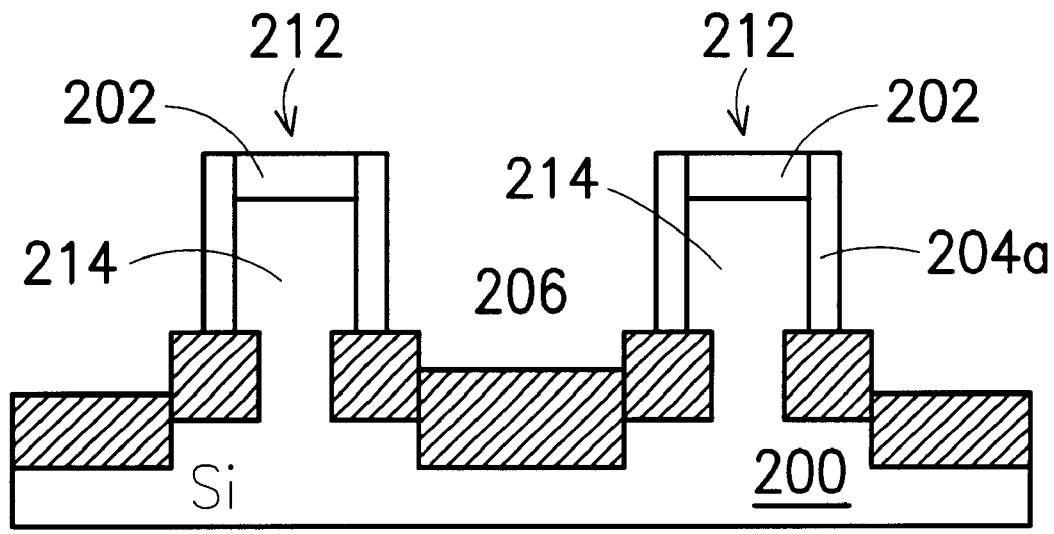

Referring to FIG. 2E, a thermal oxidation step is performed on the exposed portion of the silicon substrate 200. The silicon island structure 212 is prevented from oxidation because the silicon island structure 212 is covered by the first oxidation-resistant layer 202 and the oxidation-resistant spacers 204a. A thin foot region 214 is formed in a region between the silicon island structure 212 and the silicon substrate 200 after the thermal oxidation step.

It is very easy to control the oxidation process for obtaining a desired foot thickness in a deep submicron device. The drawbacks of the conventional etching step, such as overetching and breaking off of the island structure 112 will not occur in the invention. The thin foot region 214 is easily formed by controlling conditions of oxidation, such as time or temperature of oxidation.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of manufacturing a semiconductor device comprising the steps of:

providing a silicon substrate;

forming a first oxidation-resistant layer on the silicon substrate;

patterning the first oxidation-resistant layer and the silicon substrate to form a trench;

forming a second oxidation-resistant layer on the first oxidation-resistant layer and inside the trench;

removing a portion of the second oxidation-resistant layer to form a spacer on sidewalls of the trench;

directionally removing a portion of the exposed silicon substrate on bottom of the trench to expose a portion of the sidewalls of the trench; and performing a thermal oxidation step on the exposed portion of the sidewall of the trench.

2. The method of claim 1, wherein the first oxidation-resistant layer comprises of silicon nitride.

3. The method of claim 1, wherein the first oxidation-resistant layer is formed by chemical vapor deposition (CVD), and the thickness of the first oxidation-resistant layer is about 500 to 2000 Å.

4. The method of claim 1, wherein the second oxidation-resistant layer comprises of silicon nitride and the thickness is about 100 to 1000 Å.

5. A method of manufacturing a semiconductor device comprising the steps of:

providing a silicon substrate;

forming a first oxidation-resistant layer on the silicon substrate;

patterning the first oxidation-resistant layer and the silicon substrate to form a trench;

forming a second oxidation-resistant layer on the first oxidation-resistant layer and inside the trench;

performing a plasma etch-back process on the second oxidation-resistant layer to form a spacer on sidewalls of the trench;

performing a directional etching to expose a portion of sidewall of the trench; and performing a thermal oxidation step on the exposed portion of the silicon semiconductor.

6. The method of claim 5, wherein the first oxidation-resistant layer comprises of silicon nitride.

7. The method of claim 5, wherein the first oxidation-resistant layer is formed by CVD, and the thickness of the first oxidation-resistant layer is about 500 to 2000 Å.

8. The method of claim 5, wherein the second oxidation-resistant layer comprises of silicon nitride and the thickness of the second oxidation-resistant layer is about 100 to 1000 Å.

* * * * *